United States Patent
Wang et al.

(10) Patent No.: US 6,229,347 B1
(45) Date of Patent: May 8, 2001

(54) CIRCUIT FOR EVALUATING AN ASYSMETRIC ANTENNA EFFECT

(75) Inventors: Mu-Chun Wang, Hsinchu Hsien; Chau-Neng Wu; Shiang Huang-Lu, both of Hsinchu, all of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/228,366

(22) Filed: Jan. 11, 1999

(51) Int. Cl.[7] .................................................... H03K 5/22
(52) U.S. Cl. ................................................. 327/66; 327/77
(58) Field of Search ................................. 327/63, 65, 66, 327/77

(56) References Cited

U.S. PATENT DOCUMENTS 5,545,970 * 8/1996 Parkes, Jr. et al. .................. 327/277
5,722,052 * 2/1998 Abdi et al. .......................... 327/157
5,787,339 * 7/1998 Asazawa .............................. 327/63

* cited by examiner

Primary Examiner—Toan Tran

(57) ABSTRACT

A circuit for evaluating the asymmetric antenna effect of a transistor pair is provided, which can be implemented by using bipolar or complementary metal oxide semiconductor (CMOS) transistors to implement a differential amplifier, with which a pair of transistors Q1 and Q2 having similar characteristics are connected. The transistors Q1 and Q2 have a structure of, for example, one polysilicon layer and three metal layers, in which a second metal layer M2 and a third metal layer M3 are used for signal input, and metal layer M1 close to the gate oxide layer of both the transistors Q1 and Q2 are used to obtain a differential antenna ratio. The differential amplifier comprises transistors Q3 and Q4 serving as an active load, and transistor Q5, which is used for adjusting the voltage gain.

15 Claims, 1 Drawing Sheet

Q1$_{antenna\ effect}$ ≠ Q2$_{antenna\ effect}$

CIRCUIT FOR EVALUATING AN ASYSMETRIC ANTENNA EFFECT

BACKGROUND OF THE INVENTION

1. Field of Invention

The present invention generally relates to integrated circuit design, and more particularly to a circuit for evaluating the antenna effect in integrated circuits.

2. Description of Related Art

Among various factors causing stability problems for an electronic component in a plasma process, the antenna effect is the most salient one. During a plasma etching process, there is an ionization phenomena on the substrate surface dissociating many charged particles, due to the bombardment from the plasma. These charged particles will follow a path with minimum resistance to a capacitor with smaller capacitance. This effect will cause the plasma current tunneling through the weakly bonded silicon dioxide layer into the substrate during the fabrication process. The damaging antenna effect is because both gate electrode and substrate are conductive, together with the gate dioxide layer, a capacitor structure is therefore formed. Furthermore, a pad having a large-area conductor to which the gate electrode connects behaves like a plane antenna to accumulate external energy and attract charges on the gate surface. When the charges exceed the capacity that the capacitor can endure, the gate dioxide layer will be tunneled through and damaged.

Different devices, for example, dynamic random access memory (DRAM) or transistors in logic circuits, have different capacities to endure the antenna effect, based on which the antenna rules (AR) are derived. During a conventional semiconductor fabricating process, different patterns are designed to obtain the antenna rules, based on which design rules can be defined and impact due to the plasma process can be examined.

To measure the antenna effect, both antenna ratio of area ($A_A$), or antenna ratio of perimeter ($A_P$) can be used. Note that the higher the antenna ratio, the larger the impact from the antenna effect.

Antenna ratio of area $A_A$ is defined as:

$$A_A = M_A/G_A$$

where $M_{P_{ne}}$ is the area of interconnects, and $G_A$ is the area of the gate.

Antenna ratio of perimeter $A_P$ is defined as:

$$A_P = M_P/G_P$$

where $M_P$ is the perimeter of interconnects, and $G_A$ is the perimeter of the gate.

From the above-mentioned definitions, it is obvious that the larger the area or or perimeter of interconnects, the larger the antenna effect. On the other hand, the larger the area or perimeter of the gate, the smaller the antenna effect will be.

Actually, the antenna effect is the same for components with an identical symmetric structure, so that impact to components during the plasma etching process will be the same. The gate electrodes of every paired transistors can be fabricated with the same area or perimeter during a fabricating process. The area or perimeter of interconnects, however, are likely to be different, resulting in different antenna ratios for the paired transistors. If this asymmetric antenna effect is propagated to a sensitive amplifier in a circuit, it will not be possible to distinguish whether the degrading performance of a component is resulted from the plasma process or from the antenna effect.

SUMMARY OF THE INVENTION

It is therefore an objective of the present invention to provide a circuit for evaluating the asymmetric antenna effect of a transistor pair. Impact to every paired transistors can be analyzed from the differential antenna ratio obtained, based on which component parameters, for example, the standard deviation of threshold voltage and transconductance, can be monitored. Furthermore, an understanding as to what extent the asymmetric antenna effect will impose on the differential circuit operation can also be investigated.

In accordance with the foregoing and other objectives of the present invention, a circuit design for evaluating the asymmetric antenna effect of a transistor pair is provided, which can be implemented by using bipolar or complementary metal oxide semiconductor (CMOS) transistors to implement a differential amplifier, with which a pair of transistors Q1 and Q2 having similar characteristics are connected. The transistors Q1 and Q2 have a structure of, for example, one polysilicon layer and three metal layers, in which a second metal layer M2 and a third metal layer M3 are used for signal input, and metal layer M1 close to the gate oxide layer of both the transistors Q1 and Q2 are used to obtain a differential antenna ratio. The differential amplifier comprises transistors Q3 and Q4 serving as an active load, and transistor Q5, which is used for adjusting the voltage gain.

BRIEF DESCRIPTION OF THE DRAWINGS

The accompanying drawing are included to provide a further understanding of the invention, and is incorporated in and constitute a part of this specification. The drawing illustrates embodiments of the invention and, together with the description, serves to explain the principles of the invention.

DESCRIPTION OF THE PREFERRED EMBODIMENTS

Figure 1:
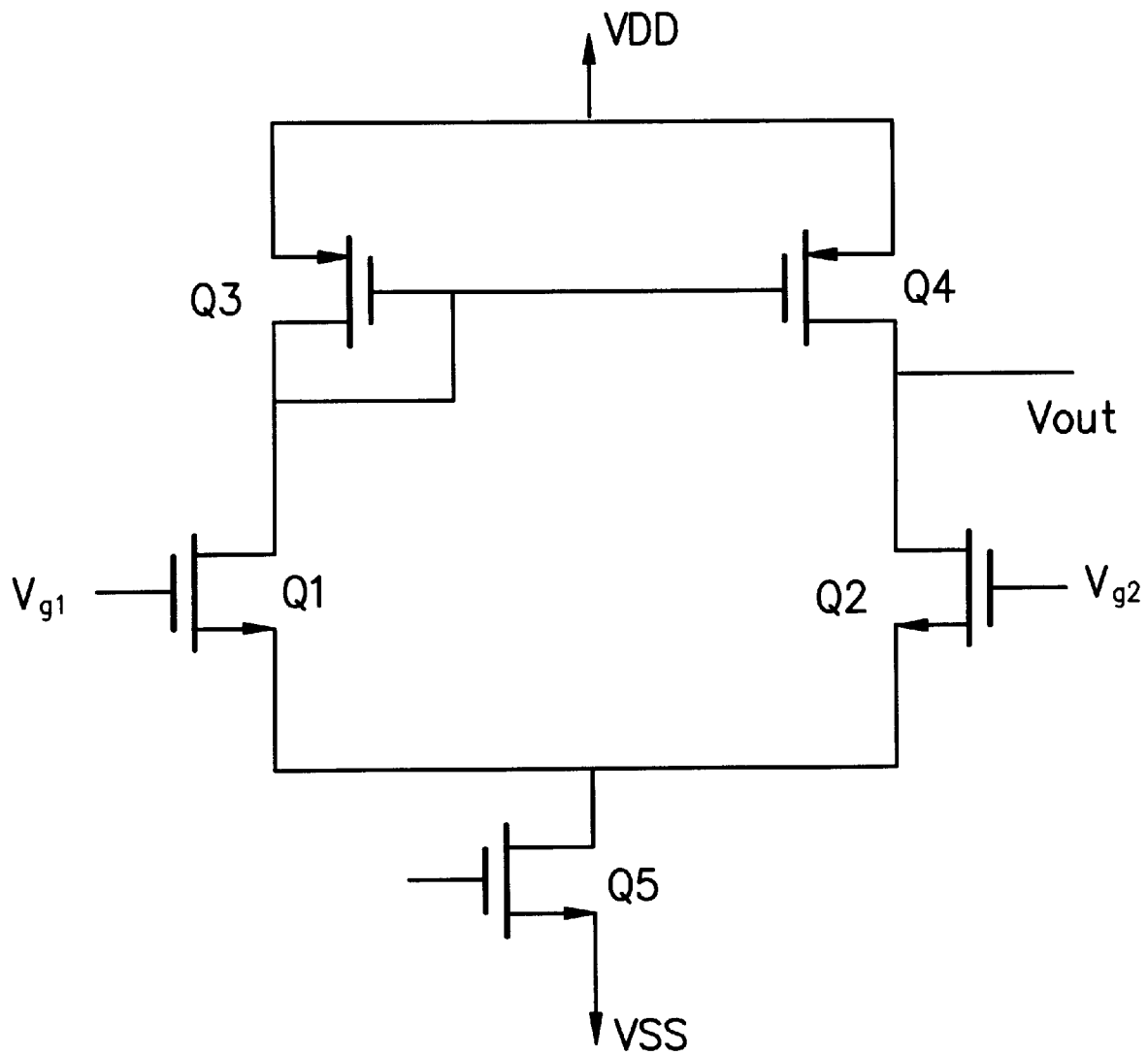
FIG. 1 is a circuit diagram of a differential amplifier for measuring the asymmetric antenna effect according to a preferred embodiment of the present invention.

Reference will now be made in detail to the present preferred embodiments of the invention, examples of which are illustrated in the accompanying drawing. Wherever possible, the same reference numbers are used in the drawing and the description to refer to the same or like parts.

Refer to FIG. 1, which shows a circuit diagram of the differential amplifier for measuring the asymmetric antenna effect according to the preferred embodiment of the present invention. The first transistor Q1 and the second transistor Q2 are paired and have similar characteristics. The transistor structure includes, for example, one polysilicon layer and three metal layers. The polysilicon layer is used as a gate electrode, the second metal layer M2 and the third metal layer M3 on a pad are used as the signal input for the transistors, and the first metal layer M1 close to the gate oxide layer is used to obtain the antenna ratio of the transistor. Since the interconnects for the transistors Q1 and Q2 are different, the resulting antenna ratios are different so that the asymmetric antenna effect between these two transistors can be measured.

In the present invention, a simple differential amplifier is used to implement the circuit for measuring the asymmetric antenna ratio. A third transistor Q3 and a fourth transistor Q4 constitute an active load, while a transistor Q5 is used to sense the difference between the transistor Q3 and transistor Q4. The transistors Q1 and Q2 are connected to the transistors Q3 and Q4, respectively. VDD is a voltage source from a power supply, connecting the transistors Q3 and Q4. VSS provides a ground potential connecting the transistor Q5. The transistors Q1 and Q2 are both connected to the transistor Q5. There is a first gate voltage $V_{g1}$ applied to the gate of the first transistor Q1, and a second gate voltage $V_{g2}$ applied to the gate of the second transistor Q2.

Since the transistors Q1 and Q2 possess different antenna ratios, the antenna effect for the transistors Q1 and Q2 due to the accumulated charges are therefore different. The difference of the antenna effect between the transistors Q1 and Q2 will be sensed by the transistor Q5, which works together with the transistors Q3 and Q4 to amplify the difference of antenna effect between the transistors Q1 and Q2 and produce an output voltage Vout. By adjusting the transistors Q3, Q4, and Q5, various scaled output voltages can be obtained.

The preferred embodiment of the present invention employs CMOS transistors to implement the differential amplifier. Bipolar transistors, however, can also be used to provide the same functions, based on which component parameters, for example, the standard deviation of threshold voltage and trans-conductance, can be monitored. Furthermore, an understanding as to what extent the asymmetric antenna effect will impose on the differential circuit operation can also be investigated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for evaluating an asymmetric antenna effect, comprising:

a first transistor and a second transistor both having similar characteristics, wherein a first gate voltage is applied to the gate of the first transistor and a second gate voltage is applied to the gate of the second transistor;

a third transistor and a fourth transistor both connected to a voltage source, wherein the third transistor is connected to the first transistor and the second transistor is connected to the fourth transistor; and a fifth transistor connected to the first transistor, the second transistor, and a ground potential.

2. The circuit of claim 1, wherein the first, second, third, fourth, and fifth transistors are metal oxide semiconductor (MOS) transistors.

3. The circuit of claim 1, wherein the first, second, third, fourth, and fifth transistors are complimentary metal oxide semiconductor (CMOS) transistors.

4. The circuit of claim 1, wherein the first transistor and the second transistor have different antenna ratios.

5. The circuit of claim 1, wherein the difference of the antenna effect between the first transistor and the second transistor is sensed by the fifth transistor so as to produce an indicating voltage output.

6. The circuit of claim 1, wherein the third transistor and the fourth transistor act as an active load.

7. The circuit of claim 1, wherein the fifth transistor is used to adjust the voltage gain.

8. The circuit of claim 1, wherein the third, fourth, and fifth transistors work together to amplify the difference of the antenna effect between the first transistor and the second transistor.

9. A circuit for evaluating the asymmetric antenna effect, comprising:

a first bipolar transistor and a second bipolar transistor both having similar characteristics, wherein a first base voltage is applied to the base of the first bipolar transistor and a second base voltage is applied to the base of the second bipolar transistor;

a third bipolar transistor and a fourth bipolar transistor both connected to a voltage source, wherein the third bipolar transistor is connected to the first bipolar transistor and the second bipolar transistor is connected to the fourth bipolar transistor; and a fifth bipolar transistor connected to the first bipolar transistor, the second bipolar transistor, and a ground potential.

10. The circuit of claim 9, wherein the first bipolar transistor and the second bipolar transistor have different antenna ratios.

11. The circuit of claim 9, wherein the difference of the antenna effect between the first bipolar transistor and the second bipolar transistor is sensed by the fifth bipolar transistor so as to produce an indicating voltage output.

12. The circuit of claim 9, wherein the third bipolar transistor and the fourth bipolar transistor act as an active load.

13. The circuit of claim 9, wherein the fifth bipolar transistor is used to adjust the voltage gain.

14. The circuit of claim 9, wherein the third, fourth, and fifth bipolar transistors work together to amplify the difference of the antenna effect between the first bipolar transistor and the second bipolar transistor.

15. A circuit for evaluating an asymmetric antenna effect, comprising:

a first transistor, with a first antenna ratio and supplied with a first gate voltage to cause a first antenna effect;

a second transistor, with a second antenna ratio and supplied with a second gate voltage to cause a second antenna effect;

a third and a fourth transistor, coupled to the first and the second transistor, respectively and supplied with a voltage source, wherein the third and the fourth transistor function as active loads;

a fifth transistor coupled to the first and the second transistor and supplied with a ground level, wherein the fifth transistor functions to adjust a difference between the first antenna effect and the second antenna effect, so that the difference between the first and the second antenna effects is amplified by the third, the fourth and the fifth transistors; and an output, to output the amplified difference between the first and the second antenna effects.

* * * * *